US012439138B2

(12) United States Patent
Saito et al.

(10) Patent No.: US 12,439,138 B2
(45) Date of Patent: Oct. 7, 2025

(54) SEMICONDUCTOR DEVICE AND IMAGING DEVICE

(71) Applicant: Renesas Electronics Corporation, Tokyo (JP)

(72) Inventors: Wataru Saito, Tokyo (JP); Fukashi Morishita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 175 days.

(21) Appl. No.: 18/498,278

(22) Filed: Oct. 31, 2023

(65) Prior Publication Data

US 2024/0171835 A1 May 23, 2024

(30) Foreign Application Priority Data

Nov. 18, 2022 (JP) ................................ 2022-184942

(51) Int. Cl.
*H04N 23/52* (2023.01)
*H04N 23/68* (2023.01)

(52) U.S. Cl.
CPC ......... *H04N 23/52* (2023.01); *H04N 23/6812* (2023.01); *H04N 23/687* (2023.01)

(58) Field of Classification Search
CPC .... G03B 2205/0015; G03B 2205/0038; H04N 23/6812; H04N 23/81; H04N 23/687
See application file for complete search history.

(56) References Cited

U.S. PATENT DOCUMENTS

| | | | | |
|---|---|---|---|---|
| 4,030,005 | A * | 6/1977 | Doemen | H02H 7/0833 318/400.04 |
| 7,697,033 | B2 | 4/2010 | Serikawa et al. | |
| 2017/0212154 | A1 * | 7/2017 | Otsuka | F16D 48/064 |

FOREIGN PATENT DOCUMENTS

| | | | | |
|---|---|---|---|---|
| CN | 111426874 A | * | 7/2020 | G01R 19/25 |
| JP | 2007129700 A | | 5/2007 | |
| JP | 2015121487 A | * | 7/2015 | |

* cited by examiner

*Primary Examiner* — Christopher E Mahoney
(74) *Attorney, Agent, or Firm* — SCULLY, SCOTT, MURPHY & PRESSER, P.C.

(57) ABSTRACT

A programmable gain amplifier provided in a semiconductor device includes a fully differential amplifier configured to amplify differential input voltages having an offset voltage. First and second correction voltages are input to a non-inverting input node and an inverting input node of the fully differential amplifier via first and second resistance elements, respectively.

11 Claims, 8 Drawing Sheets

SEMICONDUCTOR DEVICE AND IMAGING DEVICE

CROSS-REFERENCE TO RELATED APPLICATION

The subject application claims priority under 35 U.S.C. § 119 to Japanese Patent Application No. 2022-184942, filed on Nov. 18, 2022. The entire disclosure of Japanese Patent Application No. 2022-184942, including the specification, drawings and abstract, is incorporated herein by reference in its entirety.

BACKGROUND

The present disclosure relates to a semiconductor device and an imaging apparatus and is suitably used for, for example, an analog front end provided with a programmable gain amplifier.

As a hand shake correction mechanism used in an imaging apparatus or the like, a method of shifting a correction lens or an image sensor in accordance with the amount of detected hand shake has been known. The hand shake correction mechanism of this type includes a Hall sensor configured to detect the position of the correction lens or the image sensor and a programmable gain amplifier configured to amplify the output of the Hall sensor. Furthermore, an analog-to-digital converter (ADC) is provided behind the programmable gain amplifier.

One of the problems in the hand shake correction mechanism described above is, for example, the error factors such as Hall sensor assembly errors and characteristic variation of the Hall elements themselves. A calibration circuit to eliminate these error factors is indispensable in order to achieve accurate hand shake correction.

There is disclosed a technique listed below.

[Patent Document 1] Japanese Unexamined Patent Application Publication No. 2007-129700

For example, in the hand shake correction control circuit disclosed in FIG. 22 of Patent Document 1, a correction voltage for calibration is input to a non-inverting input terminal of an OP amplifier constituting a programmable gain amplifier. The correction voltage is generated by a digital-to-analog converter (DAC).

SUMMARY

In addition, in order to achieve the accurate hand shake correction, it is necessary to take into consideration the influence of the noise of the ADC behind the programmable gain amplifier. This is because the noise of the ADC propagating through the power supply wiring causes the power supply fluctuations of the programmable gain amplifier. Patent Document 1 mentioned above does not take into consideration the influence of the noise of the ADC. Other problems and novel features will become apparent from the description of this specification and the accompanying drawings. Note that the technique of the present disclosure is applicable not only to the case of Hall sensor but also to the general analog front end.

A programmable gain amplifier provided in a semiconductor device according to one embodiment includes a fully differential amplifier configured to amplify differential input voltages having an offset voltage. Correction voltages are input to a non-inverting input node and an inverting input node of the fully differential amplifier via resistance elements, respectively.

According the embodiment described above, it is possible to provide a semiconductor device having a programmable gain amplifier capable of performing the calibration in accordance with an offset voltage and suppressing the influence of the noise of the ADC.

DETAILED DESCRIPTION

Figure 1:
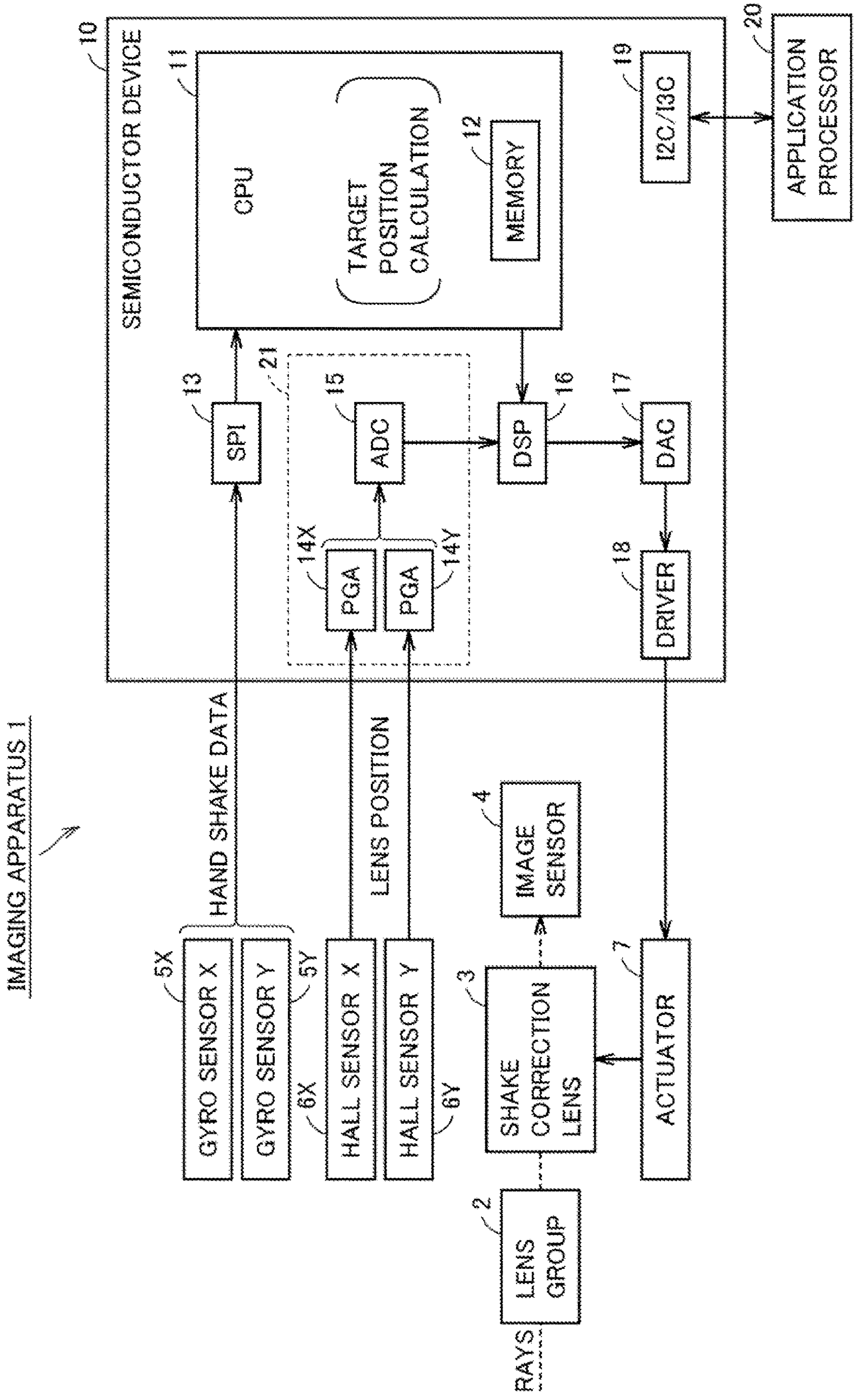
FIG. 1 is a block diagram showing a part related to hand shake correction in a configuration of an imaging apparatus.

Hereinafter, each embodiment will be described in detail with reference to the drawings. Note that the same or corresponding components are denoted by the same reference characters, and the description thereof will not be repeated.

First Embodiment

Outline of Hand Shake Correction Mechanism

FIG. 1 is a block diagram showing a part related to hand shake correction in a configuration of an imaging apparatus. An imaging apparatus (IMAGING APPARATUS) 1 includes gyro sensors (GYRO SENSOR) 5X and 5Y as sensors for detecting hand shake. The imaging apparatus 1 further includes a hand shake correction lens (SHAKE CORRECTION LENS) 3 as means for correcting hand shake. The hand shake correction lens 3 is arranged between an imaging lens group (LENS GROUP) 2 for imaging and an image sensor (IMAGE SENSOR) 4. In the present disclosure, the imaging lens group 2 and the hand shake correction lens 3 are collectively referred to as a lens group.

Furthermore, the imaging apparatus 1 includes an actuator (ACTUATOR) 7 configured to drive the hand shake correction lens 3 and Hall sensors (HALL SENSOR) 6X and 6Y configured to detect the position of the hand shake correction lens 3. In the example of FIG. 1, two Hall sensors 6X and 6Y are provided to detect the amount of lens movement in two axes of the pitch direction and the yaw direction. In association with these, two gyro sensors 5X and 5Y are provided to detect the amount of hand shake in two axes of the pitch direction and the yaw direction.

Also, the imaging apparatus 1 further includes a semiconductor device (SEMICONDUCTOR DEVICE) 10 configured to control the hand shake correction mechanism described above. The semiconductor device 10 is configured based on a microcomputer including a CPU 11 and a memory (MEMORY) 12. Also, the semiconductor device 10 is connected to an application processor (APPLICATION PROCESSOR) 20 configured to control the entire mobile terminal including the imaging apparatus 1 via an I2C bus or an I3C bus. In this way, the semiconductor device 10 operates in cooperation with the application processor 20.

The internal configuration of the semiconductor device 10 will be described below. As shown in FIG. 1, the semiconductor device 10 includes a serial peripheral interface (SPI) 13 and an analog front end 21.

The SPI 13 is an interface used when importing hand shake data (HAND SHAKE DATA) detected by the gyro sensors 5X and 5Y. The CPU 11 performs the calculation of the target position of the hand shake correction lens 3 (TARGET POSITION CALCULATION) based on the hand shake data imported via the SPI 13.

The analog front end 21 is a circuit configured to take in analog signals indicating the lens position of the hand shake correction lens 3 (LENS POSITION) from the Hall sensors 6X and 6Y. The analog front end 21 includes programmable gain amplifiers (PGA) 14X and 14Y and an ADC 15. The programmable gain amplifier 14X amplifies the analog output signal of the Hall sensor 6X, and the programmable gain amplifier 14Y amplifies the analog output signal of the Hall sensor 6Y. The ADC 15 performs the AD conversion of the amplified output signals of the Hall sensors 6X and 6Y.

The semiconductor device 10 further includes a digital signal processor (DSP) 16, a DAC 17, and a driver (DRIVER) 18.

The DSP 16 performs feedback control operation on the deviation between the positional information of the hand shake correction lens 3 output from the analog front end 21 and the target position output from the CPU 11. As the feedback control, proportional integral (PI) control or proportional integral derivative (PID) control may be performed. The DAC 17 converts the output signal of the DSP 16 into an analog signal.

The driver 18 drives the actuator 7 based on the output signal of the DAC 17. As a result, the feedback control of the position of the hand shake correction lens 3 is performed in accordance with the deviation between the lens position detected by the Hall sensors 6X and 6Y and the target position based on the hand shake data. Though simplified in FIG. 1, the actuator 7 is actually an actuator in two axes, and the driver 18 is provided individually for each actuator.

In the above description, the case of shifting the position of the hand shake correction lens 3 has been described as a hand shake correction method. Alternatively, a method of shifting the position of the image sensor 4 may be used. In this case, the Hall sensors 6X and 6Y detect the position of the image sensor 4 as a correction target, and the actuator 7 shifts the position of the image sensor 4 as a correction target.

Also, unlike the example in FIG. 1, the semiconductor device may be configured of only the part of the analog front end 21, or the semiconductor device may be configured of only the programmable gain amplifier 14. The configuration of the semiconductor device is changed in accordance with the purpose of use, mode of use, and the like.

Detailed Configuration of Analog Front End

Figure 2:
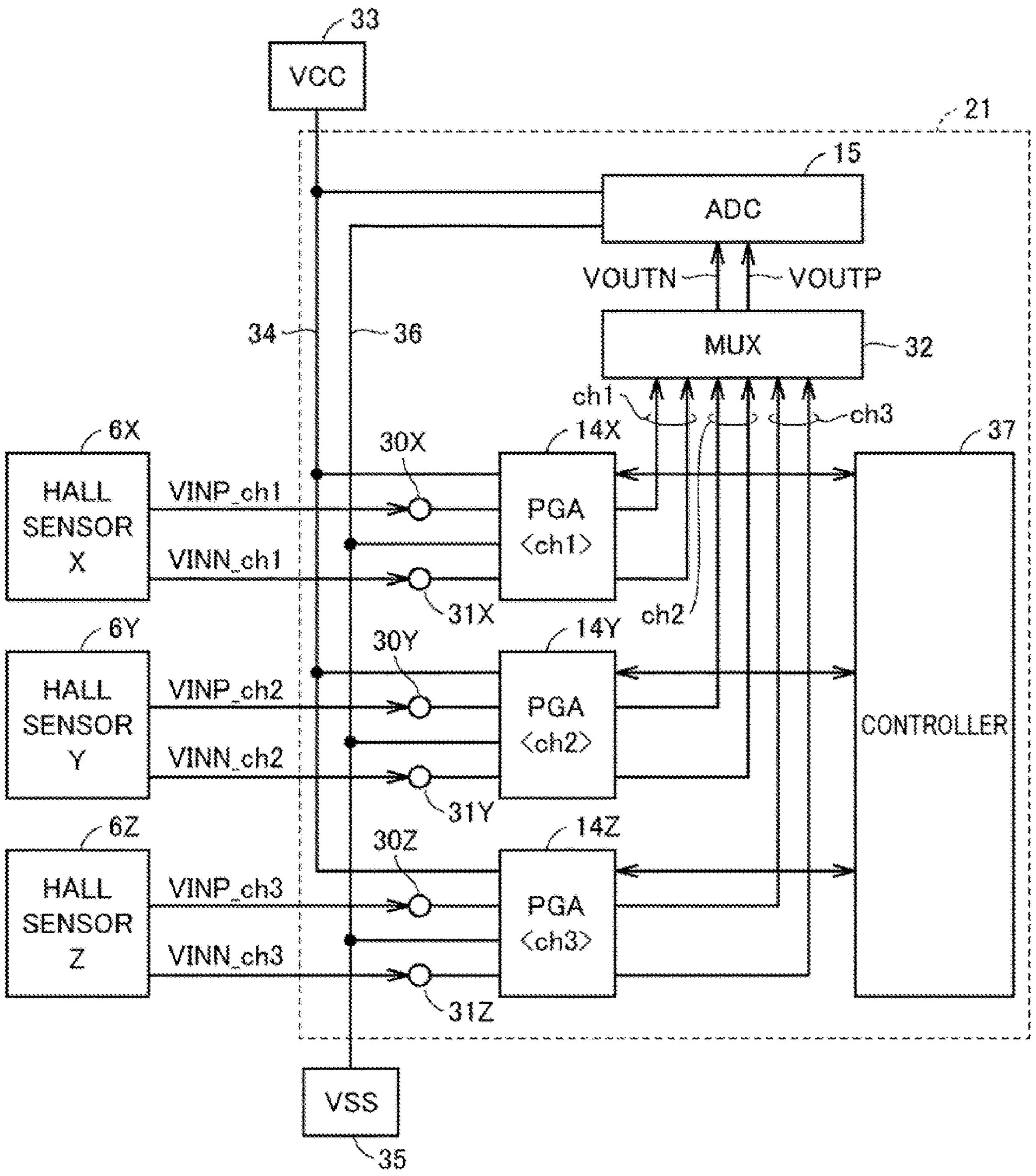
FIG. 2 is a block diagram showing a detailed configuration example of an analog front end in FIG. 1.

FIG. 2 is a block diagram showing a detailed configuration example of the analog front end 21 in FIG. 1. FIG. 2 shows an example in which the position of the hand shake correction lens 3 is detected using Hall sensors 6X, 6Y, and 6Z in three axes of the pitch direction, the yaw direction, and the Z direction. The output of each Hall sensor 6 is a differential output.

Referring to FIG. 2, the analog front end 21 includes programmable gain amplifiers 14X, 14Y, and 14Z of three channels, a multiplexer (MUX) 32, the ADC 15, and a controller (CONTROLLER) 37.

Differential input signals VINP_ch1 and VINN_ch1 are input from the Hall sensor 6X for the first axis (pitch direction) to a positive input node 30X and a negative input node 31X of the programmable gain amplifier 14X of the first channel. Similarly, differential input signals VINP_ch2 and VINN_ch2 are input from the Hall sensor 6Y for the second axis (yaw direction) to a pair of input nodes 30Y and 31Y of the programmable gain amplifier 14Y of the second channel. Also, differential input signals VINP_ch3 and VINN_ch3 are input from the Hall sensor 6Z for the third axis (Z direction) to a pair of input nodes 30Z and 31Z of the programmable gain amplifier 14Z of the third channel.

The multiplexer 32 selects one differential output voltage from the differential output voltages VOUTP and VOUTN of the programmable gain amplifiers 14X, 14Y, and 14Z of the first to third channels.

The ADC 15 performs the AD conversion of the differential output signal of the programmable gain amplifier 14 selected by the multiplexer 32.

The controller 37 controls the operations of the programmable gain amplifiers 14X, 14Y, and 14Z. Specifically, as described later, the controller 37 sets the outputs of variable resistors and DACs constituting each programmable gain amplifier 14.

The ADC 15 and the programmable gain amplifiers 14X to 14Z are connected via a power supply wiring 34 to a pad 33 to which the first power supply voltage VCC is supplied. Furthermore, the ADC 15 and the programmable gain amplifiers 14X to 14Z are connected via a power supply wiring 36 to a pad 35 to which the second power supply voltage VSS is supplied. Consequently, the operating voltage (VCC−VSS) is supplied to each of the ADC 15 and the programmable gain amplifiers 14X to 14Z.

In the following description, for the sake of simplicity, the first power supply voltage VCC is defined as a positive voltage, and the second power supply voltage VSS is defined as the ground voltage (=0V).

Points to Note in Designing Programmable Gain Amplifiers

The points to note in designing programmable gain amplifiers used in an analog front end will be described below. First, the differential input voltages VINP and VINN input from the Hall sensor 6 contain offset voltages different for each Hall sensor. This is caused by sensor assembly errors and characteristic variation of the Hall elements themselves. Therefore, it should be noted that an offset calibration circuit is indispensable.

Also, the noise from the ADC causes fluctuations in the power supply voltage because it propagates through the power supply wiring. When the resolution of the ADC is increased, the influence of noise of the ADC becomes more conspicuous. Therefore, it should be noted that the influence of noise from the ADC needs to be minimized in order to achieve highly accurate servo control. In addition, when supplying a correction voltage from the DAC to the amplifier for offset calibration, it is necessary to consider also the influence of noise of the DAC.

Furthermore, it should be noted that it is necessary to suppress the circuit area of the programmable gain amplifier in order to reduce the chip area. This is because since it is necessary to detect shift amounts of at least two axes and up to six axes or more in order to correct hand shake, the programmable gain amplifiers of at least two channels and up to six channels or more are required. Therefore, the ratio of the area of the programmable gain amplifiers to the whole chip becomes considerably large. The configuration of the programmable gain amplifier in consideration of the above points will be described below.

Configuration of Programmable Gain Amplifier

Figure 3:
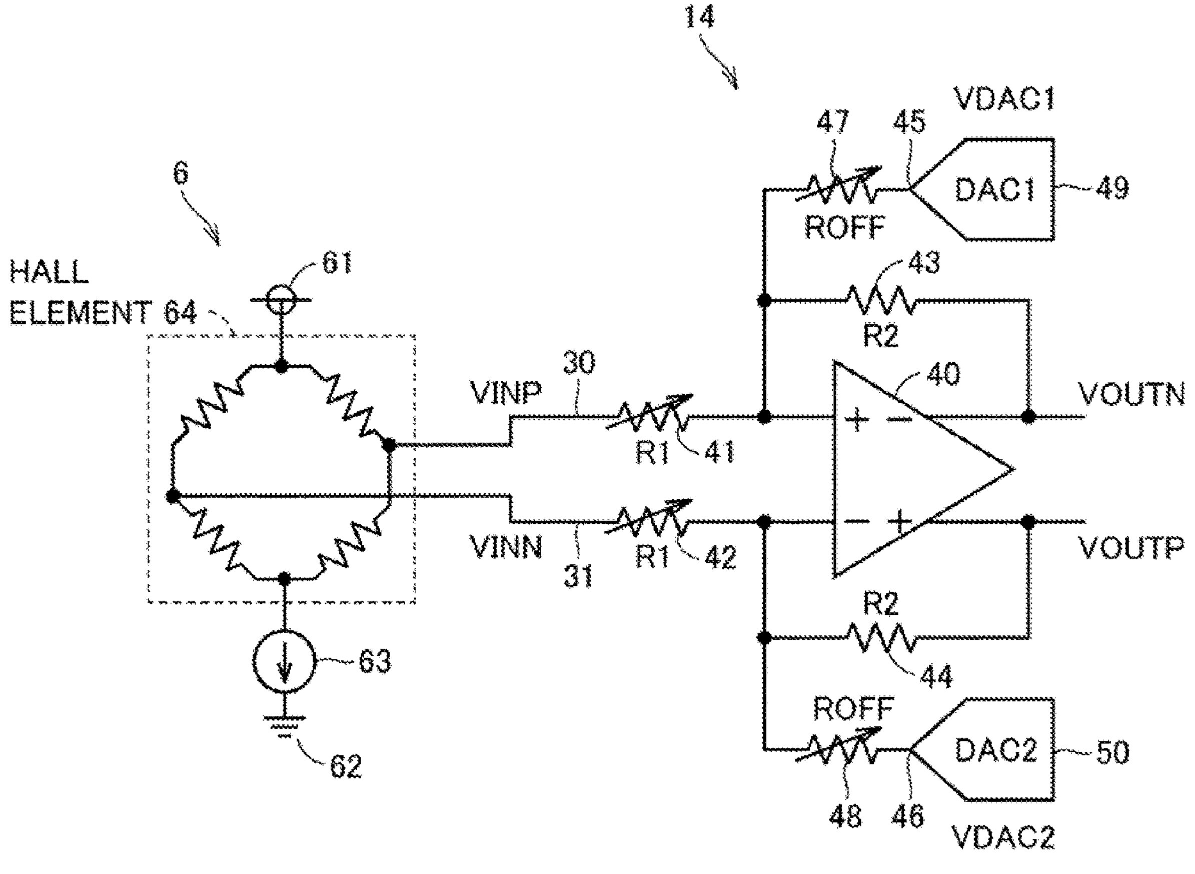
FIG. 3 is a circuit diagram showing a configuration of a programmable gain amplifier according to the first embodiment.

FIG. 3 is a circuit diagram showing the configuration of the programmable gain amplifier 14 according to the first embodiment. In FIG. 3, an equivalent circuit of the Hall sensor 6 is shown together. In the hall sensor 6, a hall element (HALL ELEMENT) 64 is connected between a power supply node 61 and a ground node 62 in series with a constant current circuit 63. The differential input voltages VINP and VINN generated by the Hall element 64 are input to a positive input node 30 and a negative input node 31.

The programmable gain amplifier 14 includes a fully differential amplifier 40, resistance elements 41 to 44, and DACs 49 and 50 and resistance elements 47 and 48 as calibration circuits. In the case of FIG. 3, the resistance elements 41, 42, 47, and 48 are variable resistance elements. Instead of the resistance elements 41 and 42, the resistance elements 43 and 44 may be variable resistance elements, or all the resistance elements may be variable resistance elements.

The connection relationship of each component in FIG. 3 will be described below. The resistance element 41 is connected between the positive input node 30 and a non-inverting input node of the fully differential amplifier 40. The resistance element 42 is connected between the negative input node 31 and an inverting input node of the fully differential amplifier 40. The resistance element 43 is connected between the non-inverting input node and an inverting output node of the fully differential amplifier 40. The resistance element 44 is connected between the inverting input node and an non-inverting output node of the fully differential amplifier 40. The resistance element 47 is connected between the non-inverting input node of the fully differential amplifier 40 and a calibration node 45 to which a correction voltage VDAC1 is input from the DAC 49. The resistance element 48 is connected between the inverting input node of the fully differential amplifier 40 and a calibration node 46 to which a correction voltage VDAC2 is input from the DAC 50.

By using the fully differential amplifier 40, it is possible to suppress the influence of the power supply fluctuation due to the noise generated by the ADC 15. Further, the controller 37 causes the DACs 49 and 50 to operate in the same operation sequence at the time of the offset voltage calibration. As a result, the influence of the noise generated by the DAC can also be suppressed.

Note that the adjustable range of each of the correction voltages VDAC1 and VDAC2 is from the power supply voltage VSS (=0) to VCC. Therefore, the adjustable range of the differential correction voltage VDAC1–VDAC2 is from –VCC to VCC. If one of the DACs 49 and 50 is used as a replica DAC to supply a reference voltage VREF (=VCC/2), the adjustable range of the differential correction voltage VDAC1–VDAC2 becomes from –VCC/2 to VCC/2.

Operation of Programmable Gain Amplifier

Next, the operation of the programmable gain amplifier 14 in FIG. 3 will be described. The resistance value of the resistance elements 41 and 42 is defined as R1, the resistance value of the resistance elements 43 and 44 is defined as R2, and the resistance value of the resistance elements 47 and 48 is defined as ROFF. The offset voltage of the differential input voltages VINP and VINN is defined as VOFFSET. In this case, the differential output voltage VOUTP–VOUTN of the fully differential amplifier 40 is represented by the following equations (1A) and (1B). The equation (1B) is obtained by factoring out R2/ROFF from the second and third terms of the equation (1A).

[Equation 1]

$$VOUTP - VOUTN = \frac{R2}{R1}\left((VINP - VINN) + \frac{R2}{ROFF}(VDAC1 - VDAC2) + \frac{R2}{R1}VOFFSET\right) \quad (1A)$$

$$= \frac{R2}{R1}(VINP - VINN) + \frac{R2}{ROFF}\left[(VDAC1 - VDAC2) + \frac{ROFF}{R1}VOFFSET\right] \quad (1B)$$

In the above equation (1B), the gain of the programmable gain amplifier 14 is the coefficient R2/R1 of the differential input voltage (VINP–VINN). Further, the offset voltage VOFFSET can be corrected by adjusting the correction voltages VDAC1 and VDAC2 and the resistance value ROFF of the resistance elements 47 and 48 such that the value in the square brackets in the second term becomes 0. In this offset correction, the coefficient ROFF/R1 of the offset voltage VOFFSET is adjusted such that the value of VDAC1–VDAC2 falls within the correctable range (that is, from –VCC to +VCC). Reducing the coefficient ROFF/R1 is equivalent to attenuating the offset voltage VOFFSET. Since the coefficient ROFF/R1 does not depend on the magnitude of the gain R2/R1 of the programmable gain amplifier 14, the offset can be adjusted by the one-stage fully differential amplifier 40 regardless of the gain. A more detailed description will be given below with reference to the waveform diagram of FIG. 4.

Figure 4:
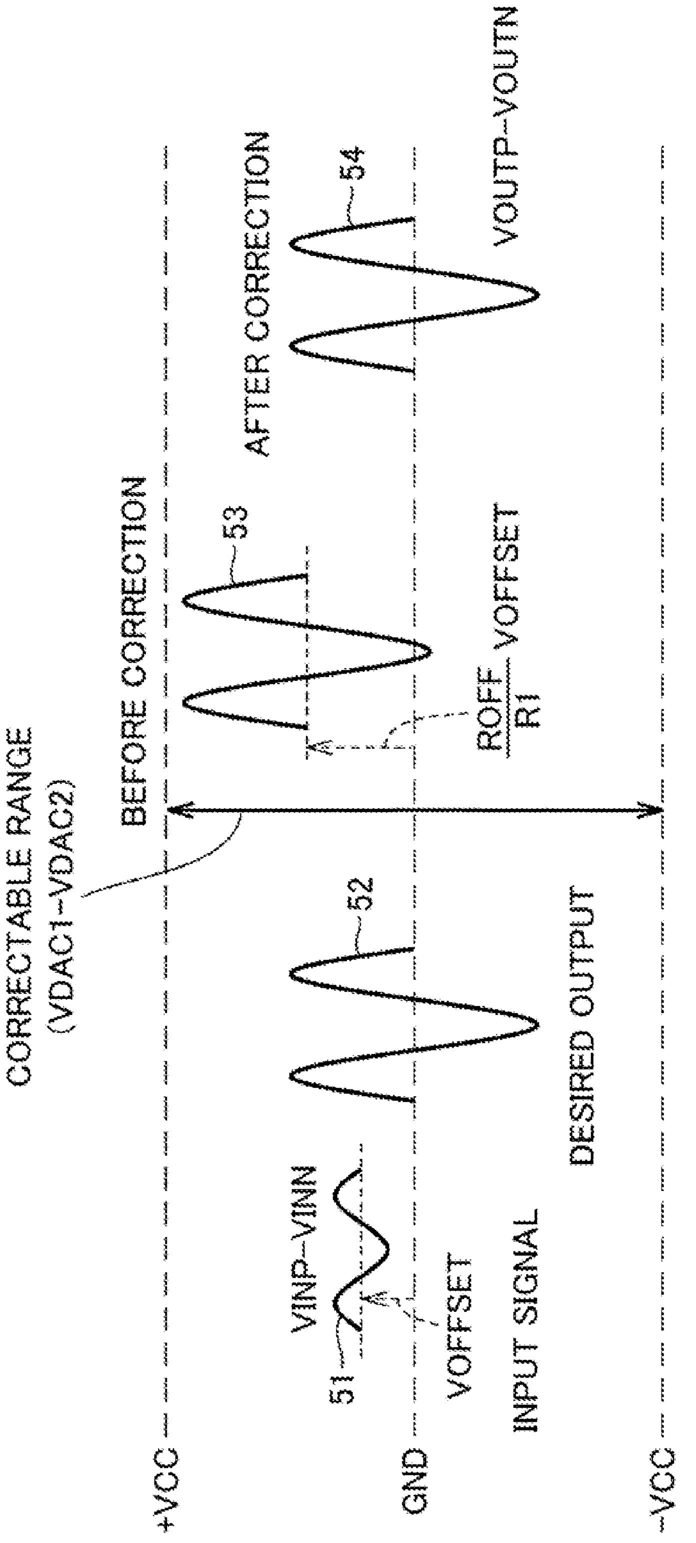
FIG. 4 is a waveform diagram for describing an operation of the programmable gain amplifier in FIG. 3.

FIG. 4 is a waveform diagram for describing the operation of the programmable gain amplifier 14 in FIG. 3. A first voltage waveform 51 in FIG. 4 represents an input signal (INPUT SIGNAL) waveform. The differential input voltage VINP–VINN contains the offset voltage VOFFSET.

A second voltage waveform 52 in FIG. 4 represents a desired output (DESIRED OUTPUT) waveform. The desired output waveform is obtained by amplifying the amplitude of the input signal waveform and correcting the offset voltage VOFFSET to zero.

A third voltage waveform 53 in FIG. 4 represents a waveform before correction of the offset voltage (BEFORE CORRECTION). The coefficient ROFF/R1 of the offset voltage VOFFSET is adjusted such that the voltage waveform 53 falls within the correctable range (CORRECTABLE RANGE) of VDAC1–VDAC2. This adjustment is possible even when the gain R2/R1 of the programmable gain amplifier 14 is large.

A fourth voltage waveform 54 in FIG. 4 represents a waveform of the differential output voltage VOUTP−VOUTN of the programmable gain amplifier 14 after correction of the offset voltage (AFTER CORRECTION). It can be seen that the same waveform as the voltage waveform 52 of the desired output is obtained.

Comparison with Single-Ended Output Differential Amplifier

Next, the effects of the programmable gain amplifier 14 according to the present embodiment will be described by comparing with the case of a single-ended output differential amplifier.

Figure 5:
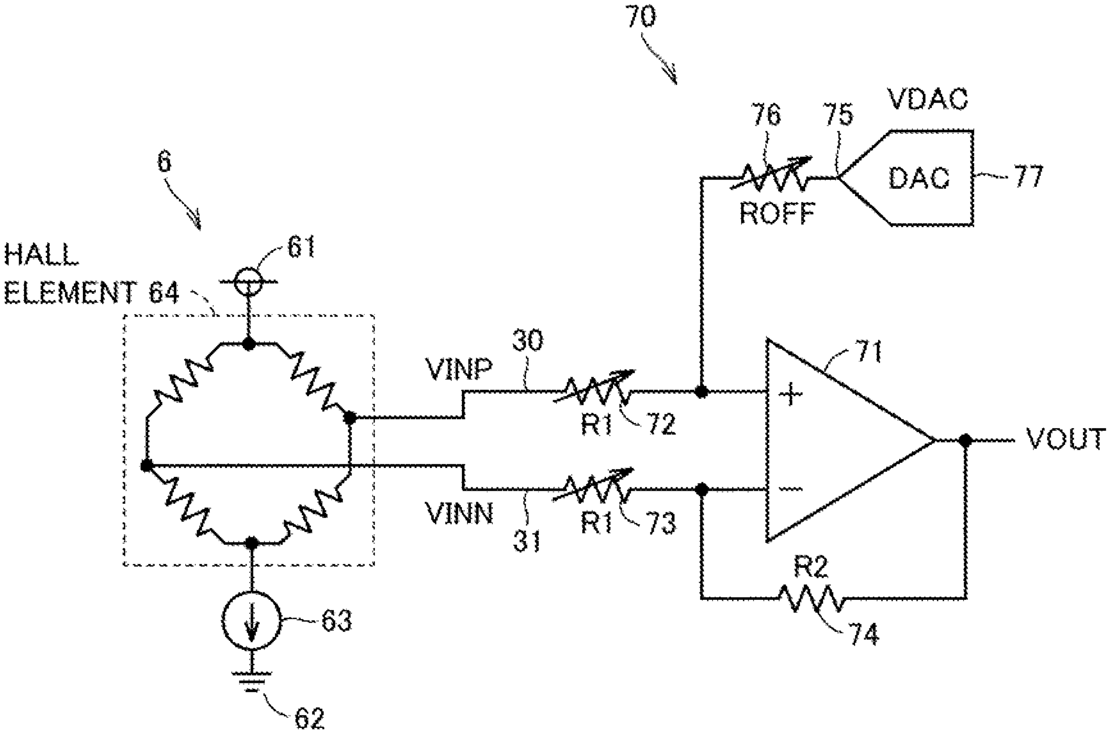
FIG. 5 is a circuit diagram showing a configuration of a programmable gain amplifier according to a comparative example.

FIG. 5 is a circuit diagram showing a configuration of a programmable gain amplifier 70 according to a comparative example. As in the case of FIG. 3, an equivalent circuit of the Hall sensor 6 is shown together.

As shown in FIG. 5, the programmable gain amplifier 70 according to the comparative example includes a single-ended output differential amplifier 71, resistance elements 72 to 74, and a DAC 77 and resistance element 76 as a calibration circuit. In the case of FIG. 5, the resistance elements 72, 73, and 76 are variable resistance elements. Instead of the resistance elements 72 and 73, the resistance element 74 may be a variable resistance element, or all the resistance elements may be variable resistance elements. The connection relationship of the above components will be described below.

The resistance element 72 is connected between the positive input node 30 and a non-inverting input node of the differential amplifier 71. The resistance element 73 is connected between the negative input node 31 and an inverting input node of the differential amplifier 71. The resistance element 74 is connected between the inverting input node and an output node of the differential amplifier 71. The resistance element 76 is connected between the non-inverting input node of the differential amplifier 71 and a calibration node 75 to which a correction voltage VDAC is input from the DAC 77.

Next, the operation of the programmable gain amplifier 70 according to the comparative example in FIG. 5 will be described. The resistance value of the resistance elements 72 and 73 is defined as R1, the resistance value of the resistance element 74 is defined as R2, and the resistance value of the resistance element 76 is defined as ROFF. The offset voltage of the differential input voltages VINP and VINN is defined as VOFFSET. In this case, the single-ended output voltage VOUT of the differential amplifier 71 is represented by the following equations (2A) and (2B). The equation (2B) is obtained by factoring out R2/ROFF from the second and third terms of the equation (2A).

[Equation 2]

$$VOUT = \left(1+\frac{R2}{R1}+\frac{R2}{ROFF}\right)(VINP-VINN)-\frac{R2}{ROFF}VDAC+\left(1+\frac{R2}{R1}+\frac{R2}{ROFF}\right)VOFFSET \tag{2A}$$

$$= \left(1+\frac{R2}{R1}+\frac{R2}{ROFF}\right)(VINP-VINN)-\left(\frac{R2}{ROFF}\right)\left[VDAC-\left\{1+\left(1+\frac{R2}{R1}\right)\frac{ROFF}{R2}\right\}VOFFSET\right] \tag{2B}$$

In the above equations (2A) and (2B), the gain of the programmable gain amplifier 70 is the coefficient (1+R2/R1+R2/ROFF) of the differential input voltage (VINP−VINN). Further, the offset voltage VOFFSET can be corrected to some extent by adjusting the correction voltage VDAC and the resistance value ROFF of the resistance element 76 such that the value in the square brackets in the second term of the equation (2B) becomes 0. However, there is a problem that {1+(1+R2/R1)·ROFF/R2} which is the coefficient of the offset voltage VOFFSET increases as the gain of the programmable gain amplifier 70 increases. Therefore, when the gain of the programmable gain amplifier 70 is relatively high, the value of the correction voltage VDAC cannot fall within the correctable range (that is, from 0 to +VCC). Conversely speaking, in order that the value of the correction voltage VDAC falls within the correctable range (that is, from 0 to +VCC), the gain of the programmable gain amplifier 70 must be limited. A more detailed description will be given below with reference to the waveform diagram of FIG. 6.

Figure 6:
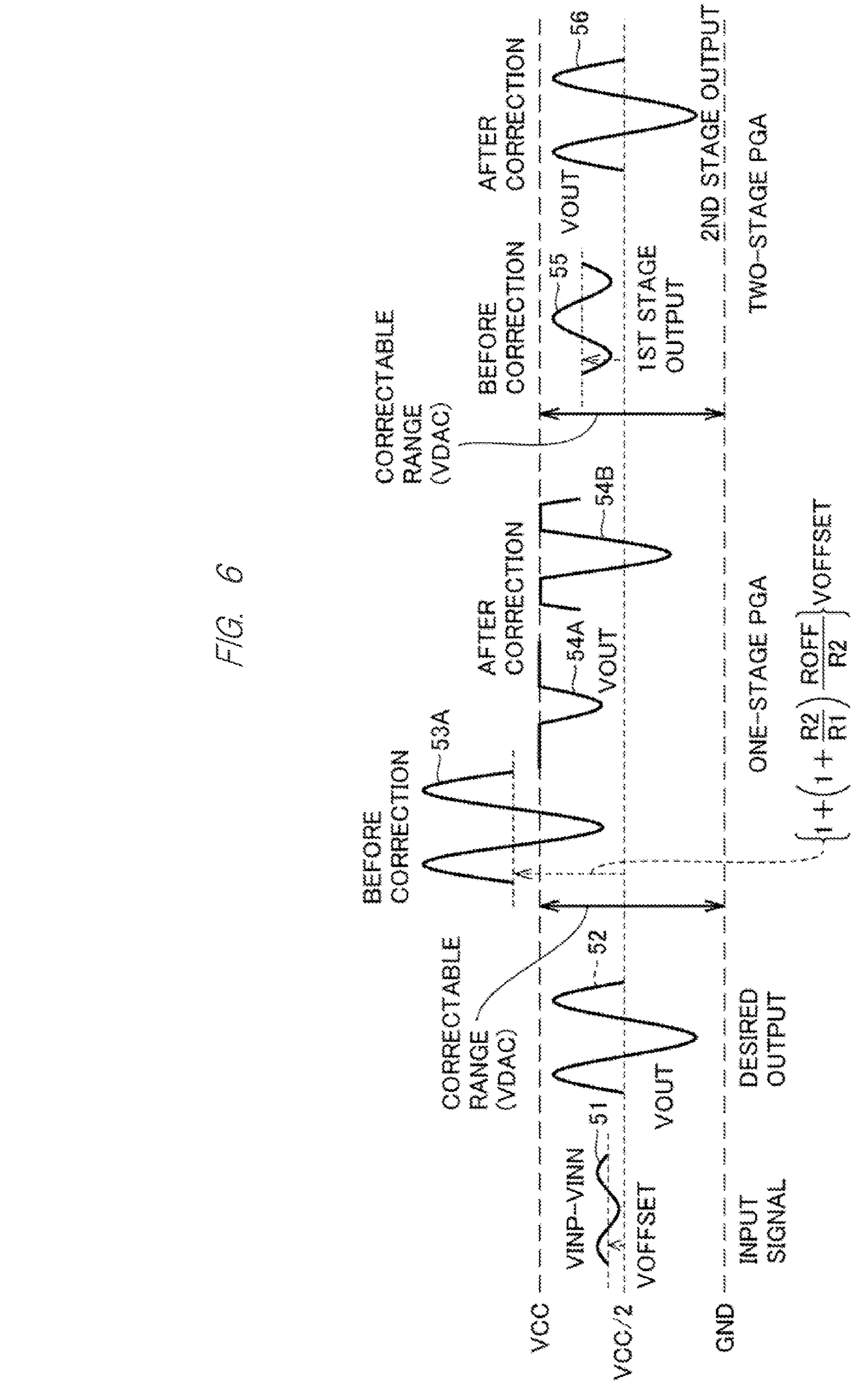
FIG. 6 is a waveform diagram for describing an operation of the programmable gain amplifier according to the comparative example in FIG. 5.

FIG. 6 is a waveform diagram for describing the operation of the programmable gain amplifier 70 according to the comparative example in FIG. 5. A first voltage waveform 51 in FIG. 6 represents an input signal (INPUT SIGNAL) waveform. The differential input voltage VINP−VINN contains the offset voltage VOFFSET.

A second voltage waveform 52 in FIG. 6 represents a desired output (DESIRED OUTPUT) waveform. The desired output waveform is obtained by amplifying the amplitude of the input signal waveform and correcting the offset voltage VOFFSET to zero.

Third and fourth voltage waveforms 53A and 54A in FIG. 6 represent the case of a programmable gain amplifier provided with a one-stage single-ended output amplifier (ONE-STAGE PGA) as shown in FIG. 5. When trying to obtain the desired gain, the offset voltage before correction (BEFORE CORRECTION) becomes too large. Therefore, the voltage waveform 53A before correction exceeds the correctable range (CORRECTABLE RANGE) of VDAC. As a result, the waveform 54A of the output voltage VOUT after the correction (AFTER CORRECTION) of the offset voltage does not become the desired output waveform. Depending on the magnitude of the gain, the waveform of the output voltage VOUT may become like the waveform 54B.

Fifth and sixth voltage waveforms 55 and 56 in FIG. 6 represent the case of a programmable gain amplifier provided with a two-stage single-ended output differential amplifier (TWO-STAGE PGA). In this case, the correction voltage VDAC is input to the non-inverting input terminal of the second-stage differential amplifier. The voltage amplification factor of the first-stage differential amplifier is limited such that the output waveform 55 of the first-stage differential amplifier (1ST STAGE OUTPUT) falls within the correctable range. As a result, the voltage waveform 56 after the correction (AFTER CORRECTION) of the offset voltage by the second-stage differential amplifier (2ND STAGE OUTPUT) can be made equal to the desired output waveform.

Effects of First Embodiment

As described above, according to the first embodiment, the fully differential programmable gain amplifier with an offset calibration function can be realized. Although it has been necessary to use the two amplifiers in series in the case of the conventional single-ended output differential amplifier, the fully differential configuration eliminates the necessity thereof. Of course, if even higher gain is required, two or more fully differential amplifiers may be connected in series. In addition, there is an advantage that the influence of noise of the ADC can be reduced by the fully differential configuration.

Also, by operating two DACs for generating the correction voltage in the same sequence at the time of the offset calibration, the influence of operation noise of the DACs can be suppressed. Further, one of the two DACs may be used as a replica DAC for generating the reference voltage VREF.

Second Embodiment

Figure 7:
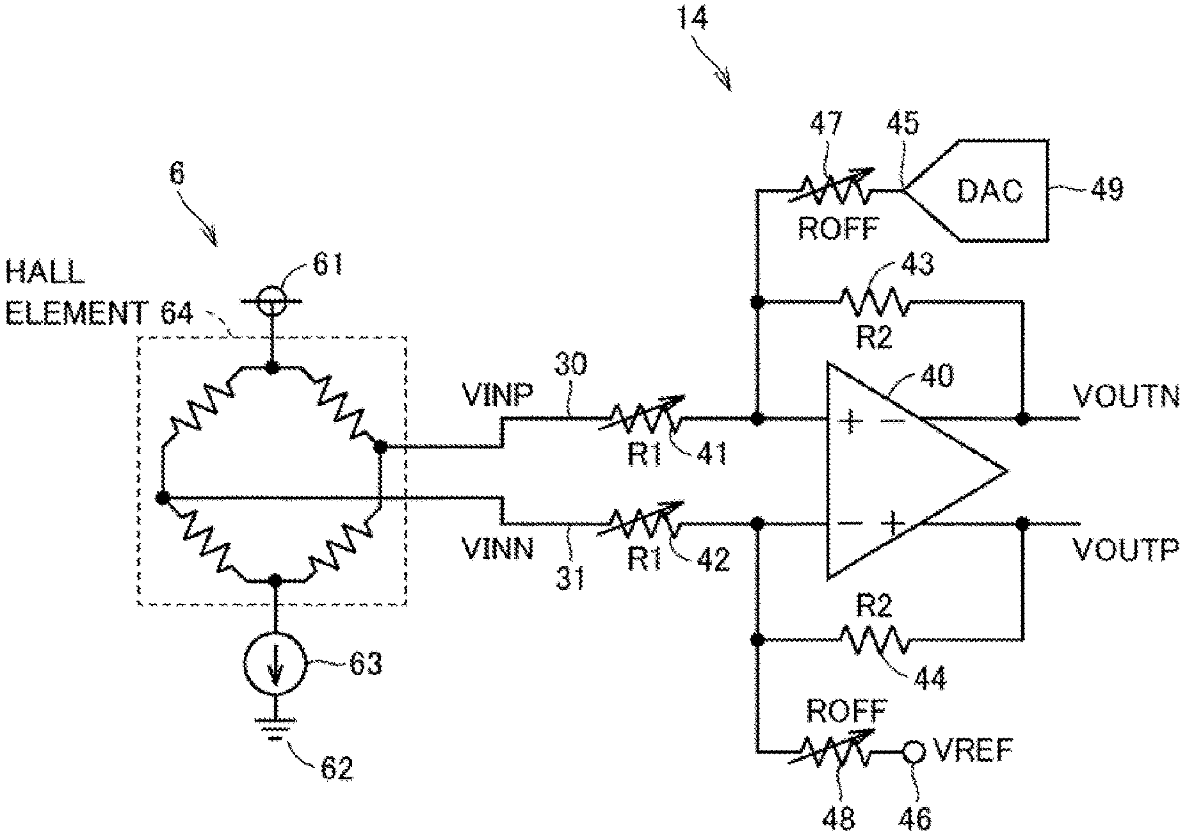
FIG. 7 is a circuit diagram showing a configuration of a programmable gain amplifier according to the second embodiment.

FIG. 7 is a circuit diagram showing a configuration of a programmable gain amplifier 14 according to the second embodiment. The programmable gain amplifier 14 in FIG. 7 differs from the programmable gain amplifier 14 in FIG. 3 in that the reference voltage VREF is used instead of the correction voltage VDAC2 output from the DAC 50. The reference voltage VREF is generated based on the power supply voltage VCC or other power supply circuit, and is set to, for example, VCC/2 (more generally VCC/2+VSS/2). In this case, the correctable voltage range by the calibration circuit is from −VCC/2 to +VCC/2.

Contrary to the above, the reference voltage VREF may be used instead of the correction voltage VDAC1 output from the DAC 49. Since the other configuration in FIG. 7 is the same as that in FIG. 3, the same or corresponding parts are denoted by the same reference characters and the description thereof will not be repeated.

With the above configuration, since the number of correction voltages VDAC is reduced by one, the circuit area of the programmable gain amplifier can be reduced, and the current consumption can be reduced. However, unlike the case of the first embodiment, the influence of noise generated from the DAC at the time of the offset voltage calibration cannot be suppressed.

Third Embodiment

The third embodiment relates to a case where a plurality of programmable gain amplifiers are provided. In this case, the number of DACs provided in each programmable gain amplifier is reduced to one, and the DACs provided in other programmable gain amplifiers can be used as replica DACs at the time of the calibration. With this configuration, the circuit area can be reduced, and the influence of operation noise of the DACs can be reduced. A detailed description will be given below with reference to the drawings.

Figure 8:
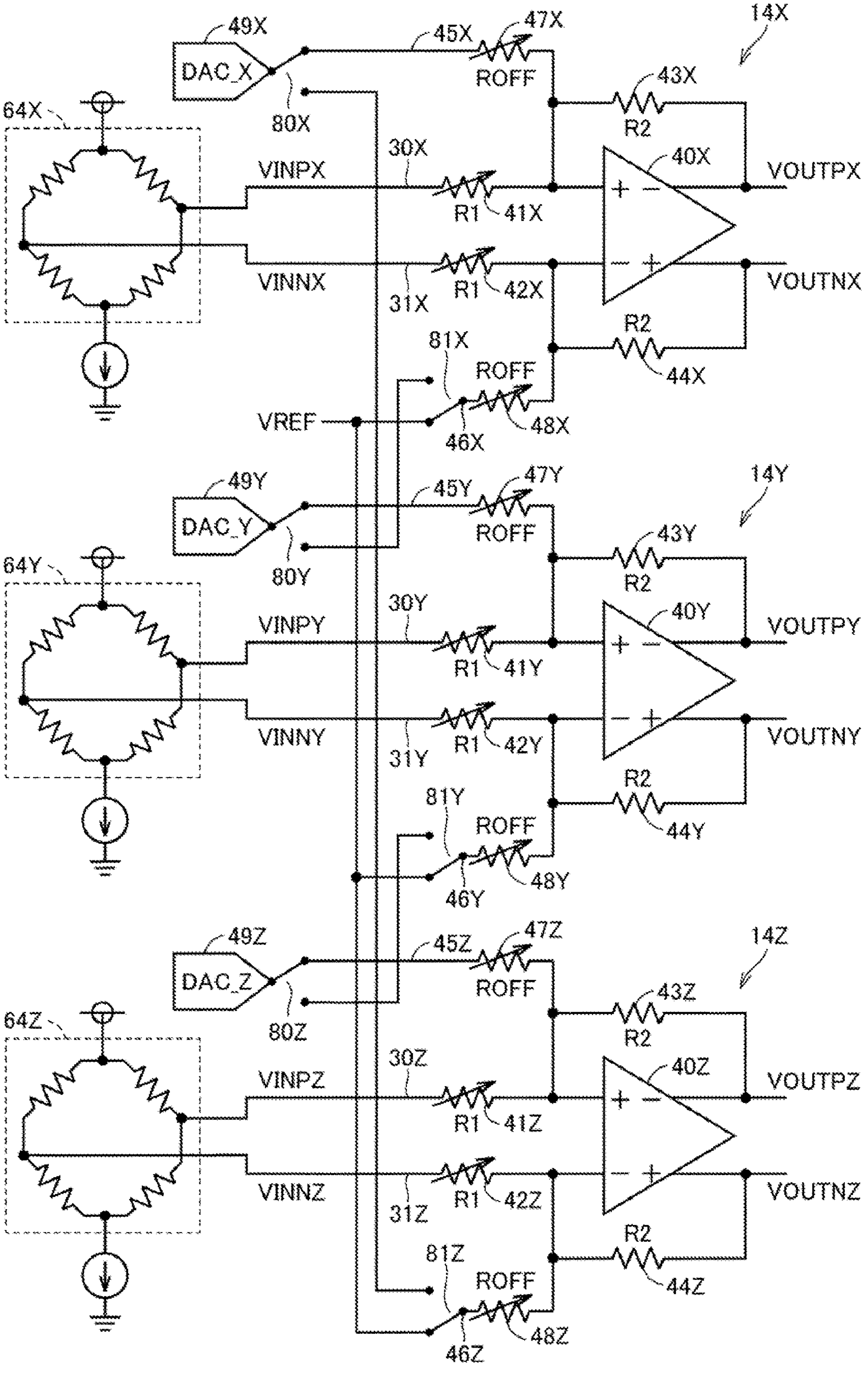
FIG. 8 is a circuit diagram showing a configuration of programmable gain amplifiers according to the third embodiment.

FIG. 8 is a circuit diagram showing a configuration of programmable gain amplifiers 14X, 14Y, and 14Z according to the third embodiment. Referring to FIG. 8, the programmable gain amplifier 14X amplifies differential input voltages VINPX and VINNX input from a Hall element 64X. The programmable gain amplifier 14Y amplifies differential input voltages VINPY and VINNY input from a Hall element 64Y. The programmable gain amplifier 14Z amplifies differential input voltages VINPZ and VINNZ input from a Hall element 64Z.

The configuration of each of the programmable gain amplifiers 14X, 14Y, and 14Z in FIG. 8 is similar to that of the programmable gain amplifier 14 in FIG. 3. Therefore, parts common to FIG. 3 are denoted by reference characters obtained by adding X, Y, or Z at the end of the reference characters in FIG. 3, and the description thereof will not be repeated. Hereinafter, parts different from FIG. 3 will be described.

First, the programmable gain amplifiers 14X, 14Y, and 14Z in FIG. 8 have DACs 49X, 49Y, and 49Z corresponding to the DAC 49 in FIG. 3, but do not have the DAC corresponding to the DAC 50. In this respect, the programmable gain amplifiers 14X, 14Y, and 14Z in FIG. 8 differ from the programmable gain amplifier 14 in FIG. 3.

In addition, the programmable gain amplifier 14X in FIG. 8 differs from the programmable gain amplifier 14 in FIG. 3 in that it further has changeover switches 80X and 81X. Similarly, the programmable gain amplifier 14Y in FIG. 8 further has changeover switches 80Y and 81Y, and the programmable gain amplifier 14Z further has changeover switches 80Z and 81Z.

The changeover switch 80X switches between inputting the correction voltage output from the DAC 49X to a calibration node 45X and supplying it to another programmable gain amplifier. The changeover switch 81X switches the voltage input to a calibration node 46X between the reference voltage VREF based on the power supply voltage generated by an external or internal power supply circuit and the reference voltage VREF generated by the DAC of another programmable gain amplifier. The same applies to the changeover switches 80Y and 81Y and the changeover switches 80Z and 81Z.

At the time of the calibration of the programmable gain amplifier 14X, the DAC 49X that generates the correction voltage is connected to the calibration node 45X by the operation of the changeover switch 80X. Furthermore, the DAC 49Y that generates the reference voltage VREF is connected to a calibration node 46Y by the operation of the changeover switches 81X and 80Y. In this way, at the time of the calibration of the programmable gain amplifier 14X, the DAC 49X for generating the correction voltage and the replica DAC 49Y for generating the reference voltage VREF are operated in the same sequence. As a result, the influence of operation noise of the DACs can be suppressed.

Similarly, at the time of the calibration of the programmable gain amplifier 14Y, the DAC 49Y that generates the correction voltage is connected to a calibration node 45Y by the operation of the changeover switch 80Y. Furthermore, the DAC 49Z that generates the reference voltage VREF is connected to the calibration node 46Y by the operation of the changeover switches 81Y and 80Z.

Also, at the time of the calibration of the programmable gain amplifier 14Z, the DAC 49Z that generates the correction voltage is connected to a calibration node 45Z by the operation of the changeover switch 80Z. Furthermore, the DAC 49X that generates the reference voltage VREF is connected to a calibration node 46Z by the operation of the changeover switches 81Z and 80X.

On the other hand, during normal use, an adjusted correction voltage generated by the DAC 49X is input to the calibration node 45X. An adjusted correction voltage generated by the DAC 49Y is input to the calibration node 45Y. An adjusted correction voltage generated by DAC 49Z is input to the calibration node 45Z. Further, a constant reference voltage VREF based on the power supply circuit is input to the calibration nodes 46X, 46Y, and 46Z. As a result, since the number of DACs to be mounted can be reduced, the circuit area can be reduced.

Contrary to the above, the programmable gain amplifiers 14X, 14Y, and 14Z may be configured such that they have DACs 50X, 50Y, and 50Z corresponding to the DAC 50 in FIG. 3 but do not have the DAC corresponding to the DAC 49. More generally, each of the programmable gain amplifiers 14X, 14Y, and 14Z may be provided with the DAC that generates one of the correction voltages VDAC1 and VDAC2 in FIG. 3.

In the foregoing, the invention made by the inventors of this application has been specifically described based on embodiments, but the present invention is not limited to the embodiments described above, and various modifications can be made within the range not departing from the gist of the present invention.

What is claimed is:

1. A semiconductor device comprising a first programmable gain amplifier, wherein the first programmable gain amplifier includes:

a positive input node and a negative input node to which differential input voltages having an offset voltage are input;

a fully differential amplifier;

a first node to which a first correction voltage is input;

a second node to which a second correction voltage is input;

a first resistance element connected between the positive input node and a non-inverting input node of the fully differential amplifier;

a second resistance element connected between the negative input node and an inverting input node of the fully differential amplifier;

a third resistance element connected between the non-inverting input node and an inverting output node of the fully differential amplifier;

a fourth resistance element connected between the inverting input node and a non-inverting output node of the fully differential amplifier;

a fifth resistance element connected between the non-inverting input node of the fully differential amplifier and the first node; and a sixth resistance element connected between the inverting input node of the fully differential amplifier and the second node.

2. The semiconductor device according to claim 1, wherein a resistance value of each of the first resistance element, the second resistance element, the third resistance element, and the fourth resistance element is set in accordance with a gain of the first programmable gain amplifier, and wherein a voltage value of each of the first correction voltage and the second correction voltage and a resistance value of each of the fifth resistance element and the sixth resistance element are set in accordance with the offset voltage contained in the differential input voltages such that an offset voltage is not contained in differential output voltages output from the non-inverting output node and the inverting output node.

3. The semiconductor device according to claim 1, wherein a resistance value of each of the first resistance element and the second resistance element is set to a first resistance value, wherein a resistance value of each of the third resistance element and the fourth resistance element is set to a second resistance value, wherein a resistance value of each of the fifth resistance element and the sixth resistance element is set to a third resistance value, wherein a ratio between the first resistance value and the second resistance value is set in accordance with a gain of the first programmable gain amplifier, and wherein a voltage value of each of the first correction voltage and the second correction voltage and the third resistance value are set in accordance with the offset voltage contained in the differential input voltages such that an offset voltage is not contained in differential output voltages output from the non-inverting output node and the inverting output node.

4. The semiconductor device according to claim 1, wherein the first programmable gain amplifier further includes:

a first digital-to-analog converter connected to the first node and configured to generate the first correction voltage; and a second digital-to-analog converter connected to the second node and configured to generate the second correction voltage.

5. The semiconductor device according to claim 4, wherein the first digital-to-analog converter and the second digital-to-analog converter are controlled to operate at the same timing when adjusting values of the first correction voltage and the second correction voltage.

6. The semiconductor device according to claim 1, wherein the first programmable gain amplifier further includes a digital-to-analog converter configured to generate one of the first correction voltage and the second correction voltage, and wherein the other of the first correction voltage and the second correction voltage is a constant reference voltage based on an external power supply.

7. The semiconductor device according to claim 6, wherein a first power supply voltage is supplied as an operating voltage to the semiconductor device, and wherein the reference voltage is half the first power supply voltage.

8. The semiconductor device according to claim 1, further comprising an analog-to-digital converter configured to convert differential output voltages output from the non-inverting output node and the inverting output node into a digital value.

9. The semiconductor device according to claim 1, wherein the differential input voltages are input from a Hall sensor.

10. The semiconductor device according to claim 1, further comprising second to n-th programmable gain amplifiers each having the same components as those of the first programmable gain amplifier, the n being an integer equal to or larger than 2, wherein each of the first to n-th programmable gain amplifiers further includes:

a digital-to-analog converter configured to generate one of the first correction voltage and the second correction voltage; and a changeover switch for selectively supplying, as the other of the first correction voltage and the second correction voltage, a constant reference voltage based on an external power supply or an output voltage of the digital-to-analog converter of another programmable gain amplifier.

11. An imaging apparatus comprising:

a lens group;

an image sensor configured to receive a light that has passed through the lens group;

an actuator configured to shift a correction target that is either a correction lens included in the lens group or the image sensor;

a Hall sensor configured to detect a position of the correction target;

a programmable gain amplifier configured to amplify differential voltages output from the Hall sensor;

an analog-to-digital converter configured to convert the amplified differential voltages into a digital value; and a driver configured to drive the actuator in accordance with a deviation between a target position based on a detected hand shake amount and the position of the correction target, wherein the programmable gain amplifier includes:

a positive input node and a negative input node to which the differential input voltages having an offset voltage are input;

a fully differential amplifier;

a first node to which a first correction voltage is input;

a second node to which a second correction voltage is input;

a first resistance element connected between the positive input node and a non-inverting input node of the fully differential amplifier;

a second resistance element connected between the negative input node and an inverting input node of the fully differential amplifier;

a third resistance element connected between the non-inverting input node and an inverting output node of the fully differential amplifier;

a fourth resistance element connected between the inverting input node and a non-inverting output node of the fully differential amplifier;

a fifth resistance element connected between the non-inverting input node of the fully differential amplifier and the first node; and a sixth resistance element connected between the inverting input node of the fully differential amplifier and the second node.

* * * * *